(12) United States Patent
Lemoine et al.

(10) Patent No.: US 12,470,174 B2
(45) Date of Patent: Nov. 11, 2025

(54) RADIOFREQUENCY AMPLIFIER

(71) Applicant: STMicroelectronics International N.V., Geneva (CH)

(72) Inventors: Renaud Lemoine, Champigny sur Marne (FR); Samia Ouyahia, Vernouillet (FR); Eric Wilhelm, Gisors (FR); Christophe Boyavalle, Triel sur seine (FR)

(73) Assignee: STMicroelectronics International N.V., Geneva (CH)

( * ) Notice: Subject to any disclaimer, the term of this patent is extended or adjusted under 35 U.S.C. 154(b) by 631 days.

(21) Appl. No.: 17/800,299

(22) PCT Filed: Feb. 15, 2021

(86) PCT No.: PCT/EP2021/053678
§ 371 (c)(1),
(2) Date: Aug. 17, 2022

(87) PCT Pub. No.: WO2021/165213
PCT Pub. Date: Aug. 26, 2021

(65) Prior Publication Data
US 2023/0092413 A1 Mar. 23, 2023

(30) Foreign Application Priority Data
Feb. 17, 2020 (EP) .................................... 20157693

(51) Int. Cl.
*H03F 1/02* (2006.01)
*H03F 1/56* (2006.01)
*H03F 3/195* (2006.01)
*H04B 1/04* (2006.01)

(52) U.S. Cl.
CPC .......... *H03F 1/0211* (2013.01); *H03F 1/565* (2013.01); *H03F 3/195* (2013.01); *H04B 1/04* (2013.01); *H03F 2200/318* (2013.01); *H03F 2200/411* (2013.01); *H03F 2200/451* (2013.01); *H03F 2200/537* (2013.01); *H04B 2001/0408* (2013.01)

(58) Field of Classification Search
CPC ........ H03F 1/0211; H03F 1/565; H03F 3/195; H03F 2200/318; H03F 2200/411; H03F 2200/451; H03F 2200/537; H04B 1/04; H04B 2001/0408
USPC ......... 330/154, 157, 165, 302, 310, 98, 133, 330/150, 79, 146, 185, 188, 190, 195, 330/276
See application file for complete search history.

(56) References Cited

U.S. PATENT DOCUMENTS

| 7,444,124 B1 | 10/2008 | Loeb et al. | |
| 8,174,315 B1 * | 5/2012 | Mangold | H03F 3/195 330/195 |
| 8,884,698 B2 * | 11/2014 | Kim | H03F 3/45475 330/276 |

(Continued)

Primary Examiner — Andrea Lindgren Baltzell
Assistant Examiner — Nareh Shamiryan
(74) Attorney, Agent, or Firm — Slater Matsil, LLP

(57) ABSTRACT

According to one aspect, an integrated circuit having a radio frequency amplifier includes at least two amplifier stages and an impedance matching device between two amplifier stages of the radio frequency amplifier. The matching device includes two lines which are coupled by electromagnetic induction. The first line is connected to an output of the first amplifier stage and the second line is connected to an input of the second amplifier stage.

20 Claims, 4 Drawing Sheets

(56) References Cited

U.S. PATENT DOCUMENTS

| | | | |
|---|---|---|---|
| 9,923,530 B2* | 3/2018 | Kao .................... | H03H 7/40 |
| 2010/0117737 A1 | 5/2010 | Kondo et al. | |
| 2011/0221522 A1* | 9/2011 | An ................ | H03F 3/45179 |
| | | | 330/126 |
| 2019/0173439 A1 | 6/2019 | Dunworth et al. | |
| 2021/0194443 A1* | 6/2021 | Maalouf ............ | H03F 1/0288 |

* cited by examiner

RADIOFREQUENCY AMPLIFIER

CROSS-REFERENCE TO RELATED APPLICATIONS

This application is a national stage of International Application No. PCT/EP2021/053678, filed on Feb. 15, 2021, which claims priority to European Patent Application No. 20157693.1, filed on Feb. 17, 2020, which applications are hereby incorporated by reference herein in their entirety.

TECHNICAL FIELD

Embodiments and implementations relate to radio frequency amplifiers, for example CMOS radio frequency amplifiers. More particularly, embodiments relate to the multi-stage radio frequency amplifiers.

BACKGROUND

A radio frequency amplifier allows amplifying a radio frequency signal.

The multi-stage radio frequency amplifiers are generally used to obtain a high gain between a signal arriving at the input of the radio frequency amplifier and a signal at the output of the radio frequency amplifier. In particular, a multi-stage radio frequency amplifier can comprise a driver stage and a power stage.

For example, the multi-stage amplifiers can be used in devices intended for the Internet of Things (also known by the acronym IOT).

Each amplifier stage can be a CMOS amplifier for example. It is also possible to use other technologies to make the amplifier stages. For example, the amplifier stages can be made from bipolar transistors.

The multi-stage radio frequency amplifiers generally comprise an impedance matching device between each stage of the radio frequency amplifier ("interstage matching network").

The impedance matching device between two stages has an input which is connected to an output of a first stage which is the most upstream among these two stages, and an output which is connected to an input of the second stage, which is the most downstream among these two stages. The impedance matching device allows adapting the output impedance of the first stage relative to the input impedance of the second stage.

In particular, as represented in FIG. 1, the power stage PSo and the associated bias circuit thereof (not represented) have an input impedance which can be represented at a given frequency by a resistor Rp_psin and a capacitor Cp_psin which are parallel to each other and relative to the power stage. Thus, the resistor Rp_psin is the real portion of the input admittance and the capacitor Cp_psin is the imaginary portion of input admittance of the power stage. For example, the input impedance of the power stage can be represented by a resistance in the range of 50Ω in parallel with a 10 pF capacitor.

Furthermore, as represented in FIG. 2, the driver stage DSo and the associated bias circuit thereof (not represented) have an output impedance which can be represented at a given frequency as a resistor Rp_dsout and a capacitor Cp_dsout which are parallel to each other and relative to the driver stage DSo. For example, the capacitance Cp_dsout has a value between 0 and 5 pF.

Moreover, as represented in FIG. 3, it is desirable to have, at the driver stage DSo, an optimum load which can be represented by a resistor Rp_load_ds and an inductor Lp_load_ds in parallel to each other and relative to the driver stage DSo.

It is desirable that the inductance Lp_load_ds of the desired load of the driver stage resonates with the capacitance Cp_dsout of the output impedance of the driver stage at said given frequency to minimise the power losses. For the same reason, it is important that the matching device has, at the power stage, an impedance having an imaginary portion equal to an inductance resonating with the capacitance Cp_psin of the input impedance of the power stage.

It is preferable that the impedance matching device is as small as possible, that it minimises the losses between the two stages and that it operates for the greatest possible bandwidth. For example, it is advantageous that the impedance matching device can operate over a bandwidth ranging between 663 MHz and 915 MHz, in particular for cellular telephony.

Moreover, the impedance matching device mainly comprises passive components.

Generally, the impedance matching device between the two amplifier stages is a circuit comprising inductive elements and capacitive elements. Such an impedance matching device allows powering the driver stage and performing a blocking of the direct current between the driver stage and the power stage.

For example, FIG. 4 illustrates an impedance matching device between a first amplifier stage DS1 and a second amplifier stage PS1. The impedance matching device IMD1 comprises an inductive element IND1 and a capacitive element CAP1 which are in series.

The impedance matching device IMD1 has an input between a first terminal of the inductive element IND1 and a first terminal of the capacitive element CAP1. This input of the impedance matching device IMD1 is connected to the output of the driver stage DS1.

The impedance matching device IMD1 also has an output which is connected to a second terminal of the capacitive element CAP1 of the matching device and to an input of the power stage PS1.

The capacitor CAP1 allows direct current isolation of the driver stage and the power stage, and enables the application of a bias voltage VGPS for the power stage.

The impedance matching device IMD1 also comprises an input connected to a second terminal of the inductive element IND1 of the impedance matching device IMD1 and to a decoupling capacitive element CD1.

A bias voltage VBAT_DS of the driver stage can be applied on the second terminal of inductive element IND1.

The values of the inductive element IND1 and the capacitive element CAP1 of the impedance matching device IMD1 are selected to have the desired load at the stage DS1.

However, the flexibility of the impedance matching device IMD1 is limited, and it is not always possible to achieve the desired load with the integrated elements.

Alternatively, the impedance matching device can be an LCL circuit, as represented in FIG. 5. In particular, FIG. 5 illustrates an impedance matching device IMD2 between a driver stage DS2 and a power stage PS2.

The impedance matching device IMD2 comprises two inductive elements IND2, IND3 and one capacitive element in series CAP2. In particular, a first inductive element IND2 has a first terminal which is connected to a first terminal of the capacitive element CAP2, and a second inductive element IND3 has a first terminal which is connected to a second terminal of the capacitive element CAP2.

The impedance matching device IMD2 has an input between the first terminal of the first inductive element IND2 and the first terminal of the capacitive element CAP2. This input is connected to the output of the driver stage DS2.

The impedance matching device IMD2 has an output between the first terminal of the second inductive element IND3 and the second terminal of the capacitive element CAP2. This output is connected to the input of the power stage PS2.

Moreover, the impedance matching device IMD2 comprises a second input at a second terminal of the first inductive element IND2.

This Second Output is Connected to a First Decoupling Capacitive Element CD2.

The impedance matching device IMD2 further comprises a third output at a second terminal of the second inductive element IND3. This third output is connected to a second decoupling capacitive element CD3.

Such an impedance matching device IMD2 facilitates achieving the desired load at the output of the driver stage DS. The value of the inductance of the first inductive element IND2, the value of the inductance of the second inductive element IND3 and the value of the capacitance of the capacitive element CAP2 are selected to obtain the real portion and the imaginary portion of the impedance desired at the output of the driver stage DS.

Such a matching device IMD2 nevertheless has the drawback of obtaining a desired load only over a short range of frequencies.

In order to increase the range of the frequencies for which the impedance matching device allows obtaining the desired load, as illustrated in FIG. 6, the impedance matching device can comprise a switched capacitive element CAP3 in parallel with the first inductive element IND2 on the driver stage side or in parallel with the second inductive element on the power stage side.

This switched capacitive element CAP3 allows modulating the value of the inductance of the inductive element IND2 so as to compensate for the frequency impact thereof.

However, such an impedance matching device IMD has several drawbacks. In particular, the resistance of the switch COM, when activated, increases the power loss of the impedance matching device. Such a power loss can be critical when the gain of the power stage is low and does not allow compensating for this power loss.

There is therefore a need to propose a radio frequency amplifier having an impedance matching device allowing obtaining good radio frequency performances. There is also a need to present such a radio frequency amplifier having reduced dimensions.

SUMMARY

According to one aspect, an integrated circuit comprising a radio frequency amplifier is proposed including: at least two amplifier stages, an impedance matching device between two amplifier stages of the radio frequency amplifier, the matching device comprising two lines which are coupled by electromagnetic induction, a first line being connected to an output of the first amplifier stage and a second line being connected to an input of the second amplifier stage.

Such an impedance matching device allows replacing an LCL circuit with or without switched capacitive element by coupled lines.

Such a matching device has the advantage of not using a decoupling capacitive element.

Furthermore, such an impedance matching device can allow avoiding the use of a switched capacitive element. A switched capacitive element can nevertheless be used in order to cover a large frequency band, for example between 1695 MHz and 2020 MHz.

Such an impedance matching device has a reduced size because the two coupled lines occupy a space in the range of that which can be occupied by an inductive element.

Furthermore, such a matching device is configured to obtain a desired load over a wide frequency range with little power losses.

The radio frequency amplifier can be selected from any type of multi-stage amplifier. For example, the radio frequency amplifier can be a power amplifier or else a low noise amplifier.

In an advantageous embodiment, the second line has dimensions allowing compensating for an input capacitive component (Cp_psin) of the second amplifier stage.

Preferably, the first line has dimensions allowing obtaining the required load (Rp_load_ds) at the output of the first amplifier stage.

Advantageously, the coupled lines are disposed so as to maximise a coupling factor between these lines.

In an advantageous embodiment, the first coupled line has a first terminal connected to the first amplifier stage and a second terminal connected to a decoupling capacitive element.

In an advantageous embodiment, the first terminal of the first line is connected to the first amplifier stage via an inductive element.

Advantageously, the first amplifier stage and the second amplifier stage are configured so as to obtain a ratio between a resistance (Rp_psin) seen at the input of the second stage and a resistance (Rp_load_ds) of the load desired at the output of the first stage of less than 5. In other words, the ratio between the real portion of the admittance desired at the output of the first stage and the real portion of the admittance seen at the input of the second stage is less than 5.

Preferably, the first line and the second line of the impedance matching device are wound around each other.

In an advantageous embodiment, the first line and the second line are wound around the decoupling capacitive element which is connected to the first line or a decoupling capacitive element which is connected to the second line. This is possible when the coupled lines are long enough to be able to be wound around one of these decoupling capacitive elements.

This allows reducing an occupation space of the impedance matching device and of the decoupling capacitive element in the integrated circuit.

Advantageously, the first amplifier stage and the second amplifier stage are CMOS radio frequency amplifiers (acronym for "Complementary metal oxide semiconductor"). However, it is also possible to use other technologies to make the amplifier stages. For example, the amplifier stages can be made from bipolar transistors.

Preferably, the first amplifier stage is a driver stage, and the second amplifier stage is a power stage. The first amplifier stage can also be a pre-driver stage and the second amplifier stage can be a driver stage.

According to another aspect, an object is proposed comprising: a radio antenna, an integrated circuit as previously defined, the radio frequency amplifier being connected to the radio antenna so as to be able to deliver, to the radio antenna, a radio frequency signal amplified from a radio frequency signal received at the input of this radio frequency amplifier.

The radio amplifier can be connected indirectly to the radio antenna, in particular via switching circuits and filters.

BRIEF DESCRIPTION OF THE DRAWINGS

Other advantages and features of the invention will appear on examination of the detailed description of implementations and embodiments, which are in no way limiting, and of the appended drawings in which.

DETAILED DESCRIPTION OF ILLUSTRATIVE EMBODIMENTS

Figure 7:
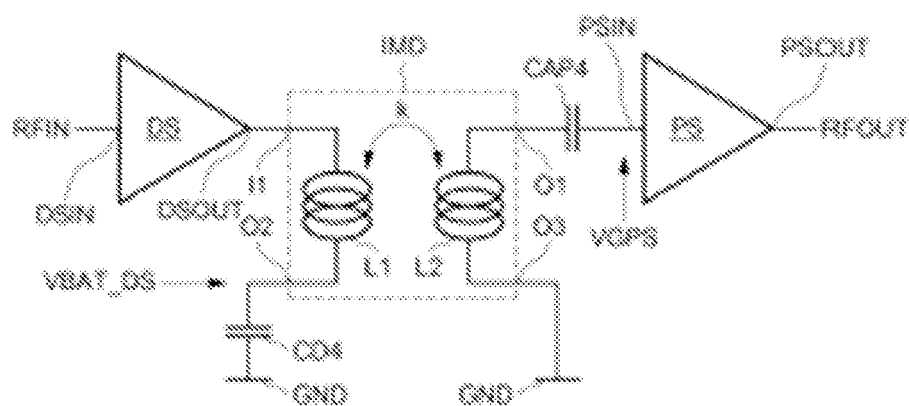
FIG. 7 is a block diagram of an embodiment integrated circuit.

FIG. 7 represents an integrated circuit IC according to one embodiment of the invention.

The integrated circuit comprises a radio frequency amplifier AMP. The radio frequency amplifier AMP is configured to amplify the power of a radio frequency signal RFIN.

The radio frequency amplifier AMP is configured to be able to be connected to a radio antenna (not represented) so as to be able to deliver an amplified radio frequency signal RFOUT to this radio antenna.

Such a radio frequency amplifier can in particular be integrated into an object comprising a radio antenna, in particular so as to be able to be used within the framework of the Internet of Things.

The radio frequency amplifier comprises two amplifier stages DS, PS. Nevertheless, it is possible to provide a radio frequency amplifier comprising more than two amplifier stages. The radio frequency amplifier can, for example, comprise three amplifier stages.

Figure 1:
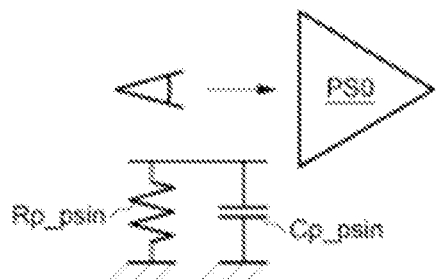
FIG. 1 is a block diagram of an impedance matching device.
Figure 2:
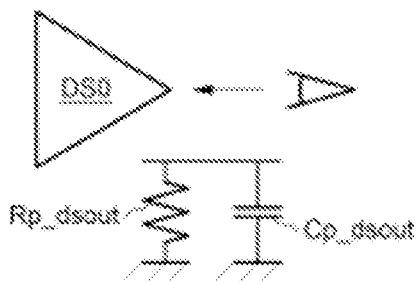
FIG. 2 is a block diagram of an impedance matching device.

In the embodiment represented in FIG. 1, the amplifier stage DS located most upstream is a driver stage and the subsequent amplifier stage PS is a power stage. Alternatively, the most upstream amplifier stage may be a pre-driver stage and the subsequent amplifier stage is a driver stage.

Each amplifier stage DS, PS is a CMOS amplifier.

Advantageously, the first amplifier stage DS (the driver stage) has an output impedance close to an input impedance of the second amplifier stage PS (the power stage).

Figure 3:
FIG. 3 is a block diagram of an impedance matching device.
Figure 4:
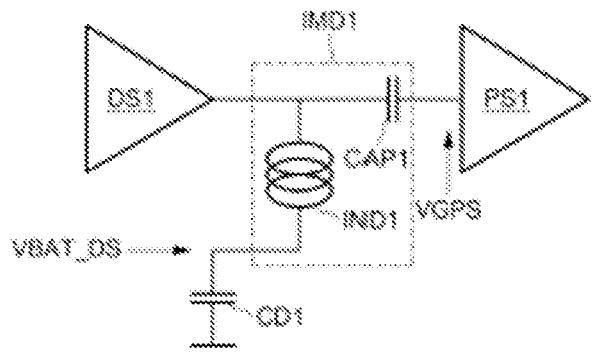
FIG. 4 is a block diagram of an impedance matching device.
Figure 5:
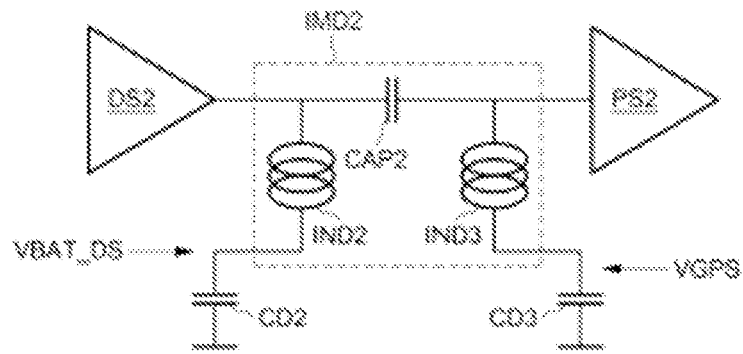
FIG. 5 is a block diagram of an impedance matching device.
Figure 6:
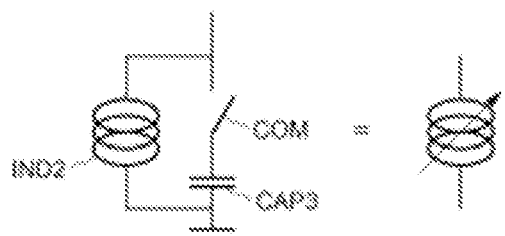
FIG. 6 is a block diagram of an impedance matching device.

In particular, the first amplifier stage DS and the second amplifier stage PS are configured so as to obtain a ratio between a resistance (Rp_psin in FIG. 1) seen at the input of the second stage and a resistance of the load (Rp_load_ds in FIG. 3) desired at the output of the first stage of less than 5.

The radio frequency amplifier AMP comprises an impedance matching device IMD between the two amplifier stages DS, PS.

The impedance matching device IMD is configured to provide a desired load at the output of the first amplifier stage DS (the driver stage) from the impedance at the input of the second amplifier stage PS (the power stage).

More particularly, the first amplifier stage DS, that is to say, the driver stage, has an input DSIN configured to receive the radio frequency signal RFIN. This first amplifier stage DS also has an output DSOUT connected to a main input I1 of the impedance matching device IMD.

The second amplifier stage PS, that is to say the power stage, has an input PSIN connected to a main output Gi of the impedance matching device IMD. This second amplifier stage PS also has an output PSOUT connected to the radio antenna, in particular via switching circuits and filters (not represented).

The impedance matching device IMD comprises two lines L1, L2 which are coupled by electromagnetic induction.

A first line L1 has a first terminal connected to the main input I1 of the impedance matching device IMD. As previously seen, this main input I1 of the impedance matching device is connected to the output DSOUT of the first amplifier stage DS.

The first line L1 also has a second terminal connected to an output O2 of the impedance matching device. This output O2 is connected to a decoupling capacitive element CD4. The decoupling capacitive element CD4 therefore has a first terminal connected to the second terminal of the first line L1 and a second terminal connected to ground GND.

A second line L2 has a first terminal connected to the main output O1 of the impedance matching device. As previously seen, this main output O1 of the impedance matching device IMD is connected to the input PSIN of the second amplifier stage PS. More particularly, the main output O1 of the impedance matching device IMD is connected to the input PSIN of the second amplifier stage PS via a capacitive element CAP4.

The capacitive element CAP4 prevents a bias VGPS of the first stage from leaking through the second coupled line L2.

The second line L2 also has a second terminal connected to an output O3 of the impedance matching device IMD. This output O3 is connected to ground GND.

The first line L1 and the second line L2 are disposed so as to be as close as possible so as to maximise a coupling factor between these two lines L1, L2.

The second line L2, which is connected to the second amplifier stage, is configured to compensate for the capacitance Cp_psin of the input impedance of the second stage DS (see FIG. 1). The width of the second line is selected so as to be large enough to comply with a current constraint (electromigration).

In particular, the inductance of the second line L2 is selected such that it is equal to $L2 = 1/(Cp\_psin\ \omega^2)$, where Cp_psin is the parallel capacitance seen at the input of the second stage PS and $\omega$ is the pulsation relative to a central operating frequency.

The first line L1, which is connected to the first amplifier stage DS, is configured to meet the resistance Rp_load_ds of the load required by the first amplifier stage DS.

In particular, when the coupling factor between the first line L1 and the second line L2 is close to 1, the inductance of the first line L1 is selected such that it is equal to $L1 = (L2 \times Rp\_load\_ds)/Rp\_psin$.

When the integrated circuit comprises several metal layers, the coupled lines L1, L2 are made with the thickest metal layer. Generally, the lines L1, L2 have a thickness of between 2 µm and 4 µm.

It may be preferred to make the coupled lines from two metal layers disposed at different heights in order to obtain two coupled lines one above the other. This allows increasing the coupling factor between the two lines.

The first line L1 which is connected to the first amplifier stage DS can also be configured to be used as a bias line for this first amplifier stage DS. In particular, a bias voltage VBAT_DS can be applied to the second terminal of the first line L1.

Figure 8:
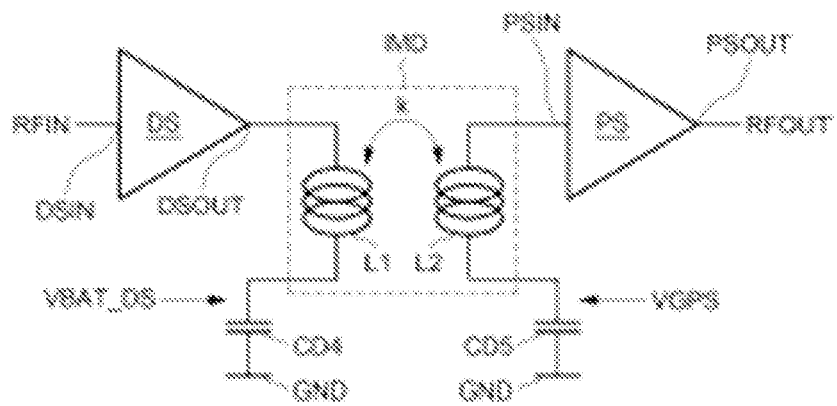
FIG. 8 is a block diagram of an embodiment integrated circuit.

It is possible to do the same for the second amplifier stage PS. In this case, as represented in FIG. 8, the second terminal of the second line L2 is connected to ground via a capacitive decoupling element CD5.

A bias voltage VGPS is then applied to the second terminal of the second line L2. Furthermore, the first terminal of the second line L2 is directly connected to the second amplifier stage PS. The integrated circuit therefore does not comprise a capacitive element between the first terminal of the second line and the second stage.

Figure 9:
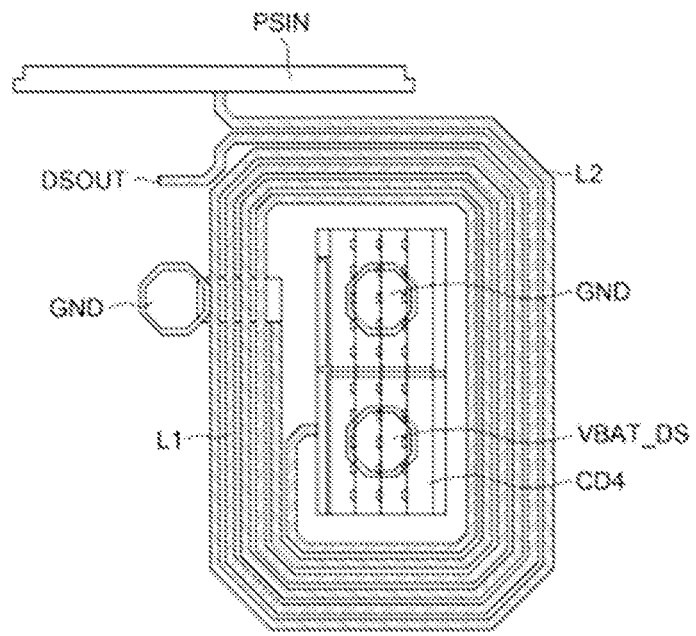
FIG. 9 is a top view of embodiment inductors L1 and L2 and other components.

As represented in FIG. 9, the second line L2 is wound around the first line L1 such that the two coupled lines are as close as possible to each other.

Furthermore, in order to optimise the space occupied by the coupled lines L1, L2, it is advantageous to wind the coupled lines around the decoupling capacitive element CD4.

The decoupling capacitive element CD4 then occupies a space in the centre of the two wound lines L1, L2. This space is required and is left unoccupied when the decoupling capacitor CD4 is placed next to the coupled lines. Alternatively, it is possible to wind the coupled lines around the decoupling capacitive element CD5.

Moreover, placing the decoupling capacitive element CD4 at the centre of the two wound lines L1, L2 allows reducing the power losses. In particular, by placing the decoupling capacitive element CD4 in the centre, the second terminal of the first line L1 can be directly connected to the decoupling capacitive element CD4 in the centre.

More particularly, when the decoupling capacitive element CD4 is not placed in the centre but next to the wound lines L1, L2, the first line passes again under the wound lines to be able to connect the second terminal thereof to the decoupling capacitive element. This can lead to power losses.

Figure 10:
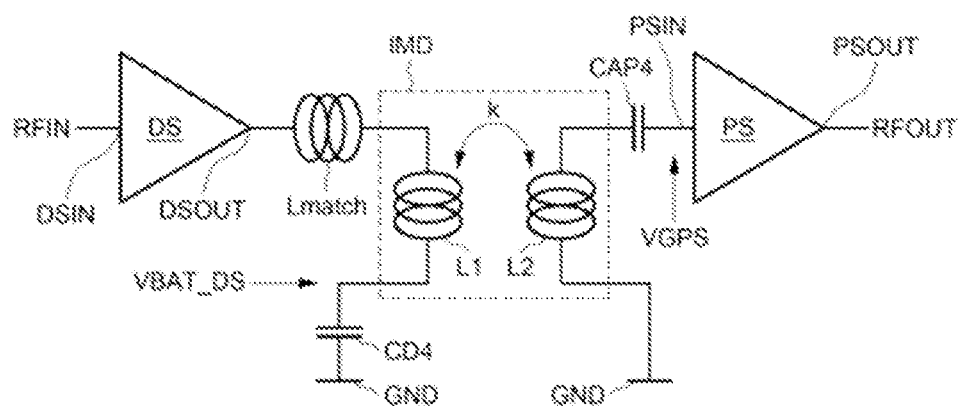
FIG. 10 is a block diagram of an embodiment integrated circuit.

FIG. 10 illustrates a variant of the integrated circuit of FIG. 8. Herein, the integrated circuit differs from that of FIG. 8 in that it comprises an impedance matching device having a main input I1 connected to the output of the first DS amplifier stage via an inductive element Lmatch.

The inductive element Lmatch is used to make the matching device IMD resonate with the capacitor of the output impedance of the first stage.

Such an inductive element Lmatch can be used when the capacitance Cp_dsout seen at the output of the first stage can have a significant impact on the performances, in particular on the gain of the amplifier and on the power added efficiency. In particular, the greater the capacitance Cp_dsout or the greater the pulsation a), the greater the leakage of the signal at the output of the first stage towards ground.

In particular, the value of the inductance of the inductive element Lmatch can be determined according to the formula:

$$Lmatch = \frac{Rp\_load\_ds^2 * Cp\_dsout * \omega}{\left(1 + (Rp\_load\_ds * Cp\_dsout * \omega)^2\right)}$$

where Rp_load_ds is the desired load of the first amplifier stage DS, Cp_dsout is the capacitance of the output impedance of the first amplifier stage DS, and ω is the pulsation relative to the operating frequency.

Furthermore, in this case the value of the inductance of the first line L1 is selected as being equal to L1=(L2× Rmatch)/Rp_psin, R_psin being the resistance of the input impedance of the second stage, Rmatch $$Rmatch = \frac{Rp\_load\_ds}{\left(1 + (Rp\_load\_ds * Cp\_dsout * \omega)^2\right)},$$

being equal to where Rp_load_ds is the desired load of the first amplifier stage DS, Cp_dsout is the capacitance of the output impedance of the first stage, and ω is the pulsation relative to the operating frequency.

A bias voltage VBAT_DS can be applied to the second terminal of the first line L1 then acts as a choke.

The described impedance matching devices can be used between two single ended or differential type amplifier stages, or between a single ended type amplifier stage and a differential type amplifier stage.

The invention claimed is:

1. An integrated circuit, comprising:
 a radio frequency amplifier, comprising:
  a first amplifier stage;
  a second amplifier stage; and
  an impedance matching circuit comprising a first inductive line and a second inductive line coupled to each other through electromagnetic induction, the first inductive line coupled to an output of the first amplifier stage, and the second inductive line coupled to an input of the second amplifier stage, wherein the first inductive line and the second inductive line are wound around each other and are wound around a decoupling capacitive element coupled to the first inductive line or the second inductive line.

2. The integrated circuit of claim 1, wherein the second inductive line is dimensioned such that the second inductive line compensates for an input capacitive component of the second amplifier stage.

3. The integrated circuit of claim 1, wherein the first inductive line is dimensioned such that the first inductive line provides a required load impedance for an output impedance characteristic of the first amplifier stage.

4. The integrated circuit of claim 1, wherein the first inductive line and the second inductive line are disposed to maximize a coupling factor between the first inductive line and the second inductive line.

5. The integrated circuit of claim 1, wherein the first inductive line comprises:
 a first terminal coupled to the first amplifier stage; and
 a second terminal coupled to the decoupling capacitive element.

6. The integrated circuit of claim 5, wherein the first terminal is coupled to the first amplifier stage via an inductive element.

7. The integrated circuit of claim 1, wherein the first amplifier stage and the second amplifier stage are configured to obtain a ratio of less than 5 between a resistance at the input of the second amplifier stage and a resistance of a desired load impedance at the output of the first amplifier stage.

8. The integrated circuit of claim 1, wherein the radio frequency amplifier is a complementary metal-oxide semiconductor (CMOS) type radio frequency amplifier.

9. The integrated circuit of claim 1, wherein the first amplifier stage is a driver stage, and wherein the second amplifier stage is a power stage.

10. A device, comprising:
a radio antenna;
an integrated circuit, comprising:
a radio frequency amplifier coupled to the radio antenna and configured to deliver an amplified radio frequency signal to the radio antenna from a radio frequency signal received at an input of the radio frequency amplifier, the radio frequency amplifier comprising:
a first amplifier stage;
a second amplifier stage; and
an impedance matching circuit comprising a first inductive line and a second inductive line coupled to each other through electromagnetic induction, the first inductive line coupled to an output of the first amplifier stage, and the second inductive line coupled to an input of the second amplifier stage, wherein the first inductive line and the second inductive line are wound around a decoupling capacitive element coupled to the first inductive line or the second inductive line.

11. The device of claim 10, wherein the second inductive line is dimensioned such that the second inductive line compensates for an input capacitive component of the second amplifier stage, and wherein the first inductive line is dimensioned such that the first inductive line provides a required load impedance for an output impedance characteristic of the first amplifier stage.

12. The device of claim 10, wherein the first inductive line and the second inductive line are disposed to maximize a coupling factor between the first inductive line and the second inductive line.

13. The device of claim 10, wherein the first inductive line comprises:
a first terminal coupled to the first amplifier stage, the first terminal coupled to the first amplifier stage via an inductive element; and
a second terminal coupled to the decoupling capacitive element.

14. The device of claim 10, wherein the first amplifier stage and the second amplifier stage are configured to obtain a ratio of less than 5 between a resistance at the input of the second amplifier stage and a resistance of a desired load impedance at the output of the first amplifier stage.

15. An integrated circuit, comprising:
a radio frequency amplifier of a complementary metal-oxide semiconductor (CMOS) type, the radio frequency amplifier comprising:
a driver stage;
a power stage; and
an impedance matching circuit comprising a first inductive line and a second inductive line coupled to each other through electromagnetic induction, the first inductive line coupled to an output of the driver stage, and the second inductive line coupled to an input of the power stage, wherein the first inductive line and the second inductive line are wound around a decoupling capacitive element coupled to the first inductive line or the second inductive line.

16. The integrated circuit of claim 15, wherein the second inductive line is dimensioned such that the second inductive line compensates for an input capacitive component of the power stage, and wherein the first inductive line is dimensioned such that the first inductive line provides a required load impedance for an output impedance characteristic of the driver stage.

17. The integrated circuit of claim 15, wherein the driver stage and the power stage are configured to obtain a ratio of less than 5 between a resistance at the input of the power stage and a resistance of a desired load impedance at the output of the driver stage.

18. The integrated circuit of claim 15, wherein the first inductive line and the second inductive line are disposed to maximize a coupling factor between the first inductive line and the second inductive line.

19. The integrated circuit of claim 15, wherein the first inductive line comprises:
a first terminal coupled to the driver stage; and
a second terminal coupled to the decoupling capacitive element.

20. The integrated circuit of claim 19, wherein the first terminal is coupled to the driver stage via an inductive element.

* * * * *